United States Patent
Lee et al.

(10) Patent No.: US 12,071,688 B2
(45) Date of Patent: Aug. 27, 2024

(54) PRECURSORS AND METHODS FOR PREPARING SILICON-CONTAINING FILMS

(71) Applicant: ENTEGRIS, INC., Billerica, MA (US)

(72) Inventors: SangJin Lee, Suwon (KR); DaHye Kim, Suwon (KR); Sungsil Cho, Anyang (KR); Seobong Chang, Suwon (KR); Jae Eon Park, HwaSung (KR); Bryan C. Hendrix, Danbury, CT (US); Thomas H. Baum, New Fairfield, CT (US); SooJin Lee, Suwon (KR)

(73) Assignee: ENTEGRIS, INC., Billerica, MA (US)

( * ) Notice: Subject to any disclaimer, the term of this patent is extended or adjusted under 35 U.S.C. 154(b) by 386 days.

(21) Appl. No.: 17/214,701

(22) Filed: Mar. 26, 2021

(65) Prior Publication Data

US 2021/0301400 A1 Sep. 30, 2021

Related U.S. Application Data

(60) Provisional application No. 63/002,855, filed on Mar. 31, 2020.

(51) Int. Cl.
| | |
|---|---|
| C23C 16/455 | (2006.01) |
| C07F 7/02 | (2006.01) |
| C07F 7/10 | (2006.01) |
| C23C 16/34 | (2006.01) |
| C23C 16/40 | (2006.01) |
| C23C 16/50 | (2006.01) |
| H01L 21/02 | (2006.01) |

(52) U.S. Cl.
CPC ........ *C23C 16/45553* (2013.01); *C07F 7/025* (2013.01); *C07F 7/10* (2013.01); *C23C 16/345* (2013.01); *C23C 16/402* (2013.01); *C23C 16/45536* (2013.01); *C23C 16/50* (2013.01); *H01L 21/02219* (2013.01); *H01L 21/02274* (2013.01); *H01L 21/0228* (2013.01); *H01L 21/02164* (2013.01); *H01L 21/0217* (2013.01)

(58) Field of Classification Search
CPC ...... C07F 7/025; C07F 7/10; C23C 16/45536; C23C 16/45553
See application file for complete search history.

(56) References Cited

U.S. PATENT DOCUMENTS

| | | |
|---|---|---|
| 2006/0258173 A1 | 11/2006 | Xiao |
| 2014/0272194 A1 | 9/2014 | Xiao |
| 2018/0245215 A1 | 8/2018 | Lei |
| 2019/0088474 A1 | 3/2019 | MacDonald et al. |

OTHER PUBLICATIONS

Voronkov (Doklady Chemistry, vol. 400, part 2, 2005, 17-20).*
Chemical Abstract compound, STNext. RN 2407346-39-6 (Entered STN: Jan. 15, 2020).
Mitzel, N. W., "Simple Silylhydrazines as Models for Si—N β-Donor Interactionsin SiNN Units", Chem. Eur. J., 1998, vol. 4, No. 4, pp. 692-698.
Sachdev, H. et al., "A New Type of Anionic Rearrangement in Metalated Benzylhydrazines", Eur. J. Inorg. Chem., 2002, vol. 6, pp. 1495-1501.

* cited by examiner

*Primary Examiner* — Pancham Bakshi

(57) ABSTRACT

Provided are certain liquid silicon precursors useful for the deposition of silicon-containing films, such as films comprising silicon, silicon nitride, silicon oxynitride, silicon dioxide, silicon carbide, carbon-doped silicon nitride, or carbon-doped silicon oxynitride. Also provided are methods for forming such films utilizing vapor deposition techniques.

15 Claims, 6 Drawing Sheets

US 12,071,688 B2

PRECURSORS AND METHODS FOR PREPARING SILICON-CONTAINING FILMS

FIELD OF THE INVENTION

In general, the invention relates to methods and precursors for the deposition of silicon-containing films onto microelectronic device surfaces.

BACKGROUND OF THE INVENTION

In semiconductor manufacturing, thin (e.g., <1000 nanometers thickness) passive layers of chemically inert dielectric materials, such as silicon nitride ($Si_3N_4$), silicon oxynitride ($SiO_xN_y$), silicon carbide (SiC), silicon carbon nitride (SiCN) and silicon carbo oxide (SiCO) and/or silicon dioxide ($SiO_2$) are widely employed in microelectronic device structures, to function as structural elements of the multilayered device such as sidewall spacer elements, diffusion masks, oxidation barriers, trench isolation coatings, intermetallic dielectric materials, passivation layers, insulators, and etch-stop layers.

Deposition of silicon-containing films by chemical vapor deposition techniques is a highly attractive methodology for forming such films. CVD processes involving low deposition temperatures are particularly desired, e.g., temperatures less than about 550° C., but require the availability of suitable silicon precursor compounds for such purpose. In some cases, higher deposition temperatures can be considered, when the thermal budget of the integrated circuit will allow. In these cases, temperatures >450° C. might be utilized to achieve the desired properties of the dielectric film, particularly in cases where a high quality silicon dioxide film is desired. In the situation where very high quality films are required and a high thermal budget is allowed, source materials that are stable to high temperatures are preferred as they enable saturated ALD pulses which give uniform step coverage over high aspect ratio structures.

Silicon nitride (SiN) has been used for source and drain spacer (S/D spacer) for FinFET and gate-all-around (GAA) structures due to its high wet etch and $O_2$ ashing resistance. Unfortunately, SiN has a high dielectric constant (k) of about 7.5. Carbon and nitrogen doped $SiO_2$ (SiCON) spacer has been developed to reduce the dielectric constant and maintain excellent wet etch and ashing resistance during post-deposition processing. Currently, the best wet etch and ashing resistive SiCON dielectrics have a k value of around 4.0. Wet etch and ashing resistive dielectrics with a k value of <3.5 are needed for next generation devices.

Additionally, there remains a need for improved organosilicon precursors and processes for the formation of silicon-containing films in the manufacture of microelectronic devices, particularly in processes utilizing low temperature vapor deposition techniques utilized for the formation of silicon nitride, silicon dioxide, and silicon oxynitride films. In particular, there is a need for liquid silicon precursors with good thermal stability during storage and gas-phase transport, high volatility, and reactivity with a substrate surface.

SUMMARY OF THE INVENTION

The invention relates generally to the formation of silicon-containing films in the manufacture of semiconductor devices, and more specifically to compositions and methods for forming such silicon-containing films, such as films comprising silicon, silicon nitride, silicon oxynitride, silicon dioxide, silicon carbide, carbon-doped silicon nitride, or carbon-doped silicon oxynitride film, in certain cases at relatively low temperatures.

Compounds of Formula (I) as set forth herein are useful as precursor compounds in the formation of such various silicon-containing films. Advantageously, the precursors of the invention can be used under low temperature vapor deposition conditions to form high quality nitride films, while also capable of use in forming high quality and high growth rate silicon dioxide films at relatively high temperatures. This versatility thus speaks to the flexibility of the precursors of Formula (I). In one embodiment, the compounds of Formula (I), such as bis(dimethylsilyl) dimethyl hydrazine, can also provide higher deposition rates of silicon dioxide films when compared to conventional silicon precursors. Similarly, the compounds of Formula (I) can be utilized to prepare silicon nitride films at higher growth rates. (See FIG. 5 below.) Films of SiN and SiCN were deposited under similar conditions in the presence of $N_2$, $NH_3$ co-reactant. Vapor deposition conditions and processes can be utilized with these precursor compounds to form the silicon-containing films, including processes such as chemical vapor deposition (CVD), atomic layer deposition (ALD), plasma-enhanced ALD (PEALD), plasma enhanced cyclical chemical vapor deposition (PECCVD), a flowable chemical vapor deposition (FCVD), a plasma-enhanced ALD-like process, or an ALD process with oxygen-containing reactants, a nitrogen-containing reactant, or a combination thereof.

DETAILED DESCRIPTION OF THE INVENTION

Figure 1:
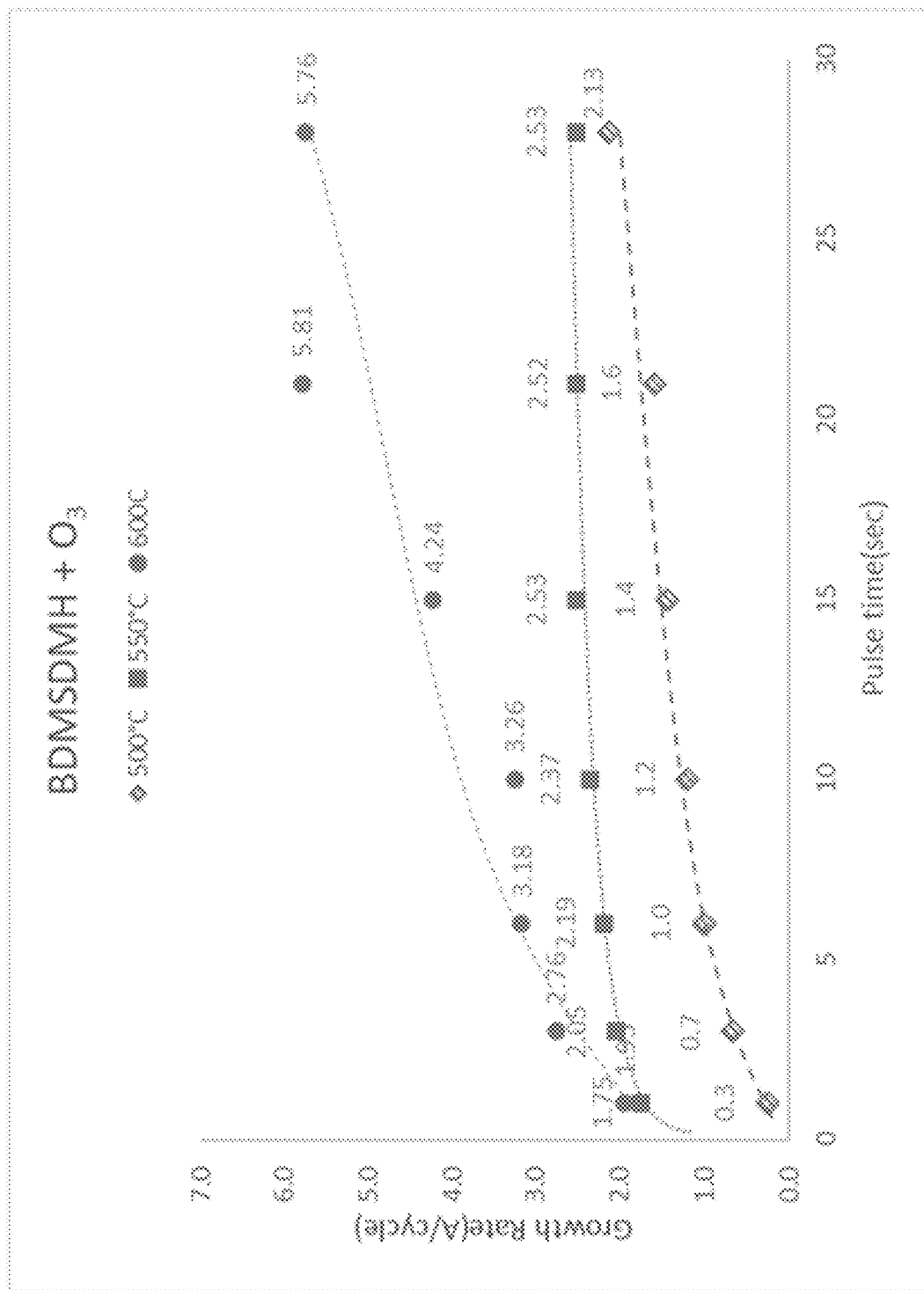
FIG. 1 is a depiction of $SiO_2$ growth rate in angstroms per cycle versus pulse time in seconds, performed at three temperatures, 5000 C, 550° C., and 600° C., using bis (dimethylsilyl) dimethyl hydrazine (Formula (I) below wherein each $R^1$ is methyl), and ozone as the oxidizing co-reactant gas. ALD saturation curves are observed for substrate temperatures <600° C., indicating saturated ALD behavior at the lower temperatures. High $SiO_2$ growth rates of >2.5 Å/cycle were noted at 550° C.
Figure 2:
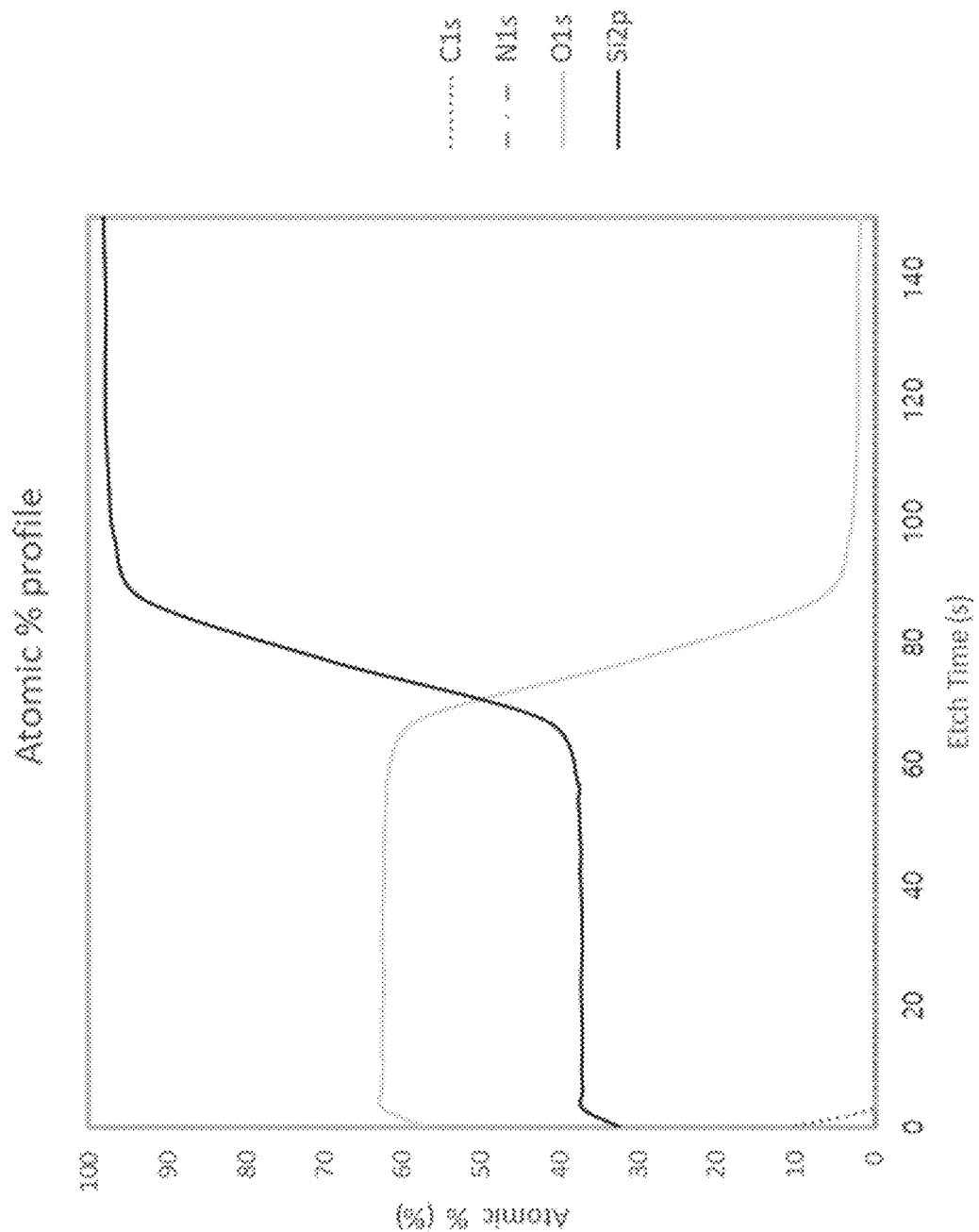
FIG. 2 is a graph of atomic percentage, measured by x-ray photoelectron spectroscopy (XPS) as a function of etch time in seconds (depth profiling), for a pure $SiO_2$ film as deposited by a similar process described in FIG. 1. No N or C are observed after removal of the environmental cap layer on the film. The relative ratio of Si:O content reflects the composition of an $SiO_2$ film.
Figure 3:
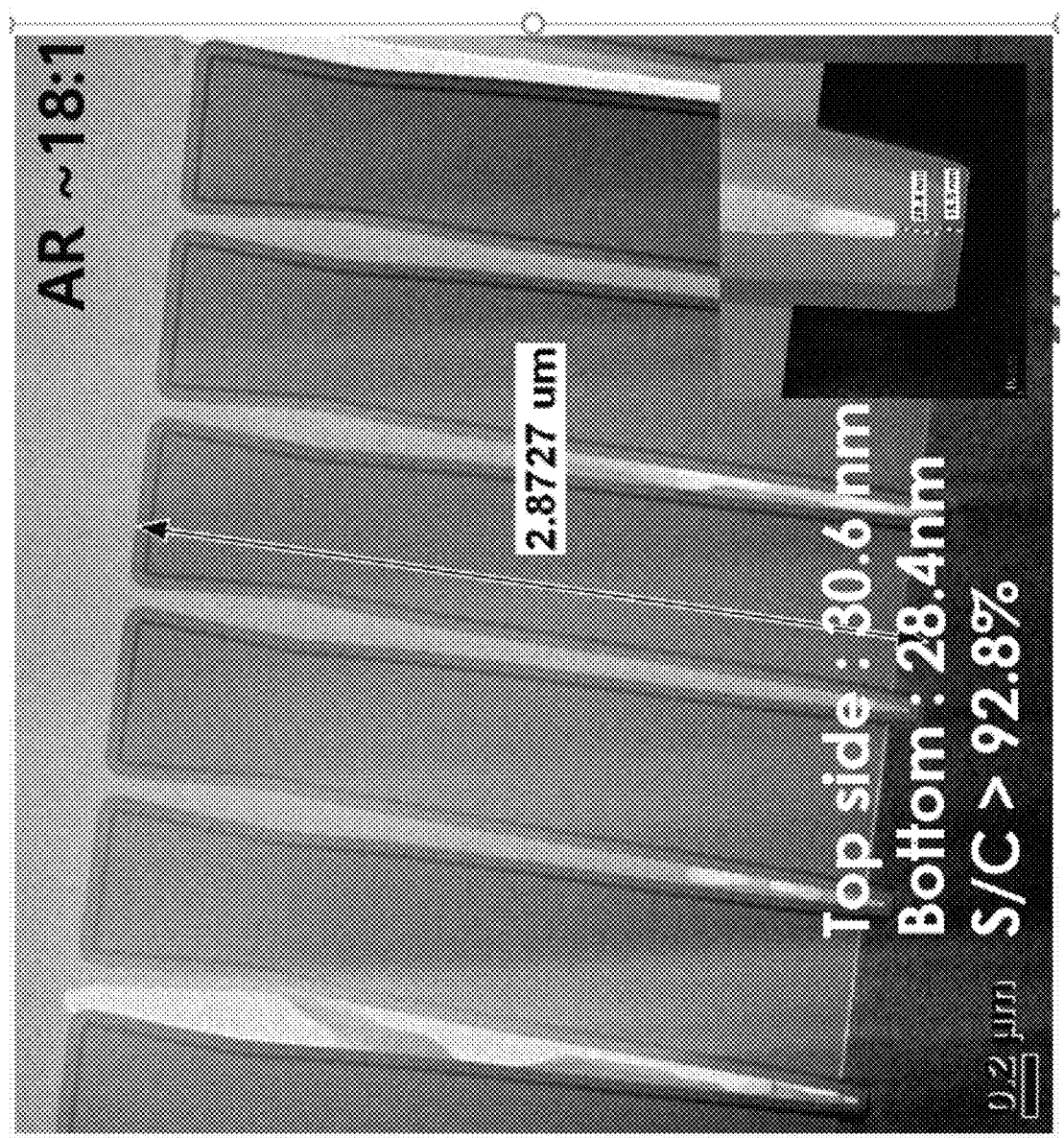
FIG. 3 Illustrates the deposition of an $SiO_2$ film with >92% conformal step coverage, achieved by the precursor chemistry and process described in FIG. 1, on a $SiN/SiO_2/Si$ trench structure with an 18:1 aspect ratio.
Figure 4:
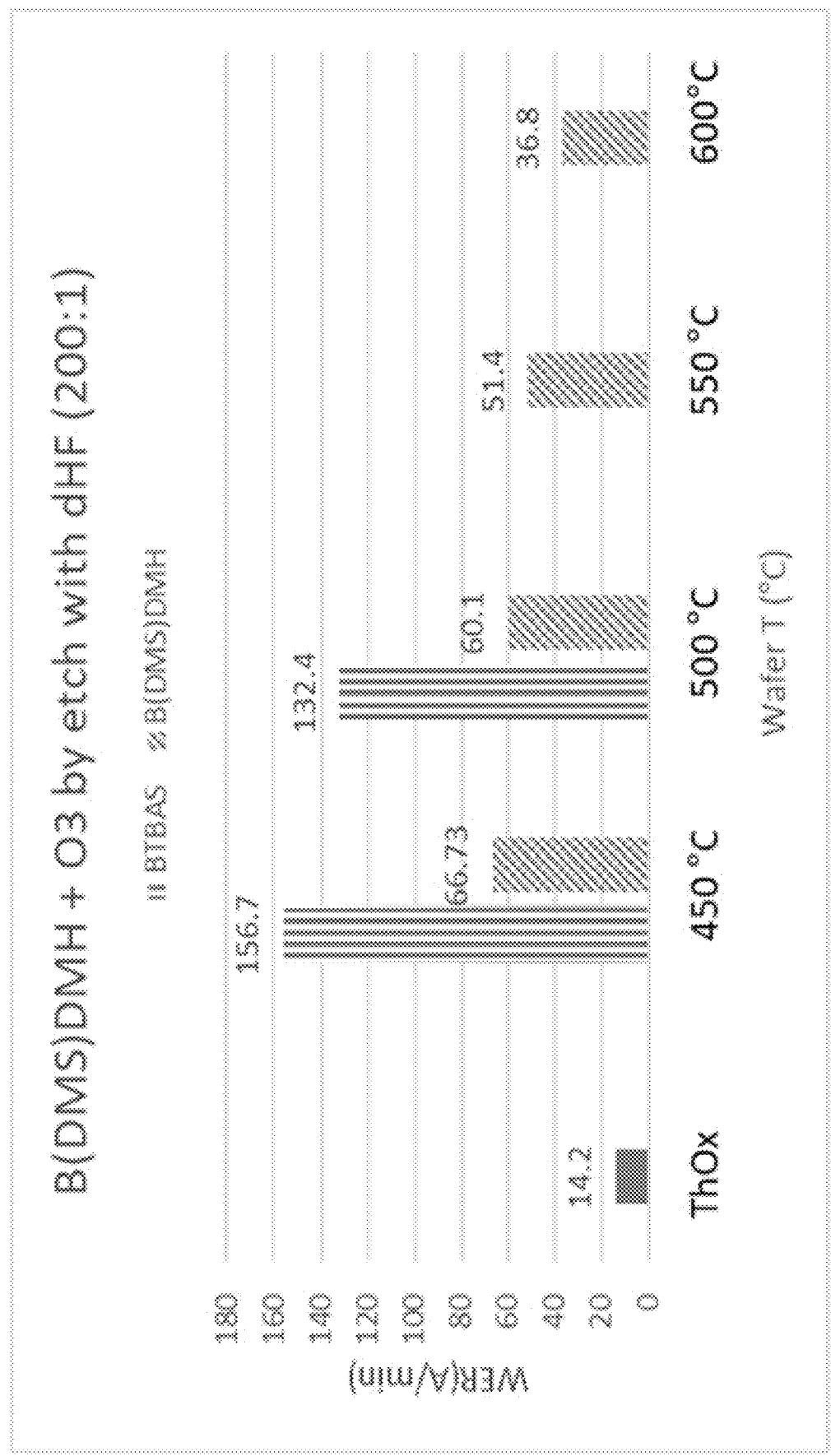
FIG. 4 is a comparison of the wet etch rates for films deposited from bis(dimethylsilyl) dimethyl hydrazine (BDMSDMH) to films deposited from bis(t-butylamino) silane (BTBAS) at various substrate temperatures. The wet etching was performed with a 200:1 aqueous HF solution. The wet etch rates in this case represents approximately >60% improvement for the films deposited from bis(dimethylsilyl) dimethyl hydrazine precursor when compared to the films from BTBAS. The wet etch rates are also compared to the wet etch rate for thermal oxide ($SiO_2$).
Figure 5:
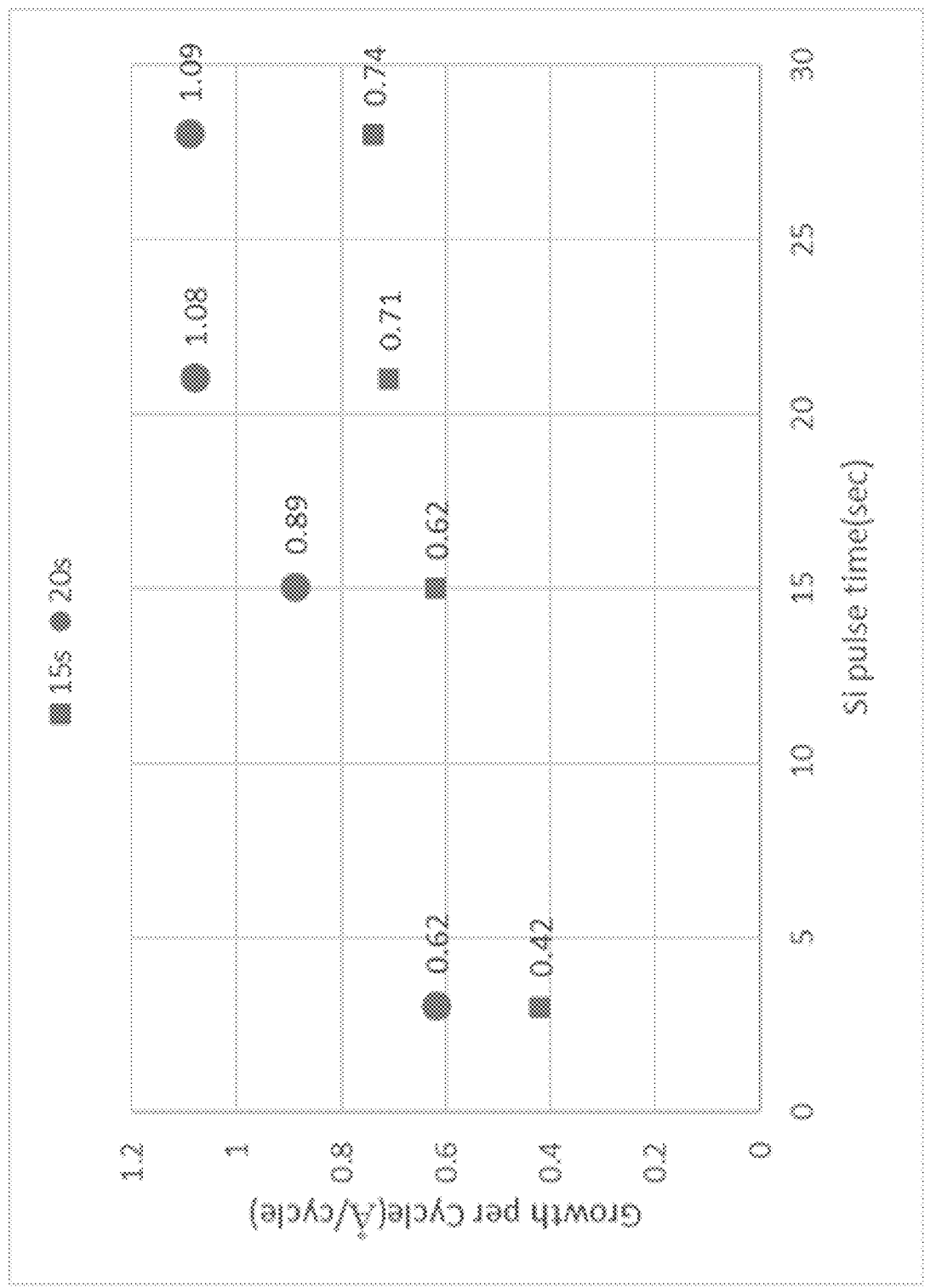
FIG. 5 illustrates the growth rate per cycle as a function of silicon pulse time under the influence of $N_2$ plasma exposure for a silicon nitride deposition process using bis(dimethylsilyl) dimethyl hydrazine as precursor at 250° C., and a nitrogen flow rate of 300 sccm at 200 watts plasma power. The cycle sequence utilized was (i) precursor with pulse length plotted on the x axis, (ii) purge for 20 seconds, (iii) nitrogen plasma for 15 seconds (square) or 20 seconds (circle), followed by (iv) purge for 20 seconds.
Figure 6:
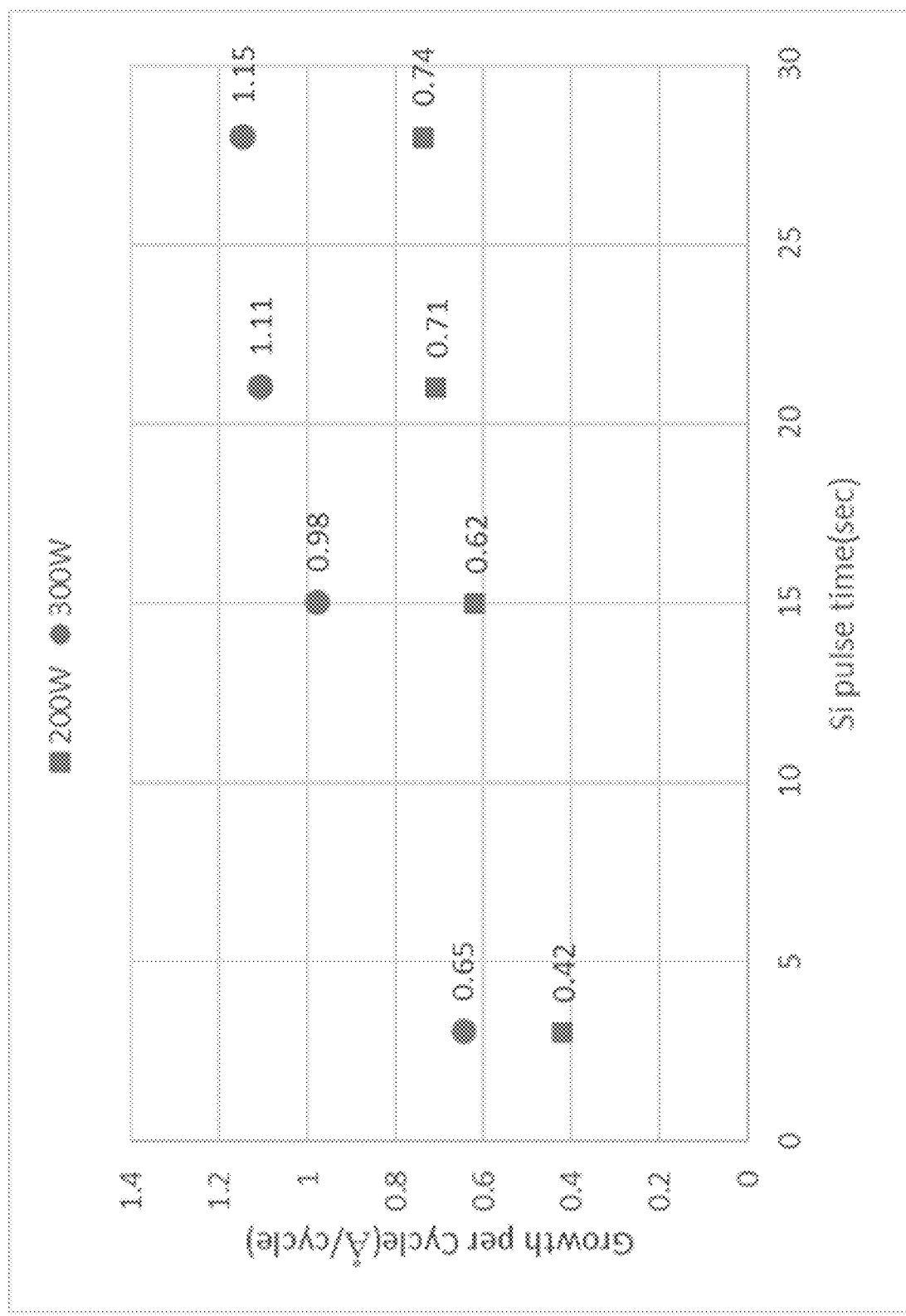
FIG. 6 illustrates the effect of nitrogen plasma power (200 watts or 300 watts) on the growth rate per cycle when using different pulse times of bis(dimethylsilyl) dimethyl hydrazine as precursor, under similar reactor and plasma deposition conditions as described in FIG. 5 with the plasma exposure time of 15 seconds.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides a compound of Formula (I):

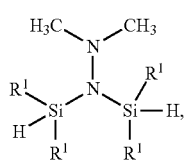

(I)

wherein each $R^1$ is independently chosen from hydrogen, $C_1$-$C_4$ alkyl, or a halogen atom chosen from Cl, Br, and I. In one embodiment, each $R^1$ is methyl.

The compounds of Formula (I) are useful as precursors for the deposition of silicon-containing films onto the surface of microelectronic devices. In certain embodiments, the films also contain nitrogen and/or oxygen and/or carbon.

Thus, in a second aspect, the invention provides a method for depositing a silicon-containing film onto a surface of a microelectronic device, which comprises introducing at least one compound of Formula (I) to said surface in a reaction chamber, under vapor deposition conditions.

The compounds of Formula (I) can be prepared according to the following reaction scheme:

Step 1

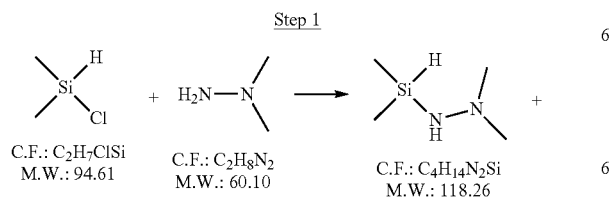

-continued

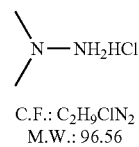

C.F.: $C_2H_9ClN_2$
M.W.: 96.56

In Step 1, a chlorosilane is reacted with dimethylhydrazine to provide a silyl hydrazido intermediate and a hydrazine hydrochloride by-product.

Step 2

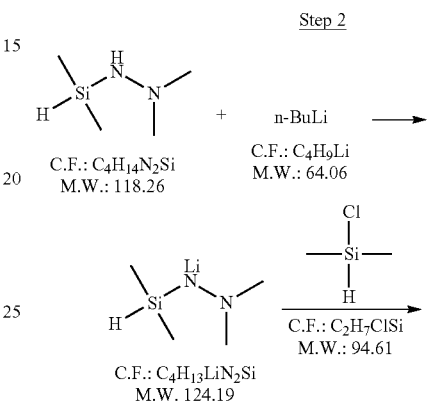

As shown above in step 2, the hydrazido dimethylsilane (or some other hydrazido $(R^1)_2$—silane) can be reacted with n-butyl lithium or some other reactive alkali metal $C_1$-$C_6$ alkane. optionally containing a nitrogen atom. Other potential reactants include methyl lithium, t-butyl lithium, lithium diisopropylamide, methyl potassium, n-butyl potassium, etc., to afford the novel intermediate (II) as shown below:

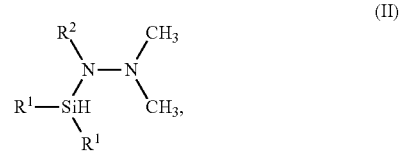

(II)

wherein each $R^1$ is independently chosen from hydrogen, $C_1$-$C_4$ alkyl, or a halogen atom chosen from Cl, Br, and I, and wherein $R^2$ is chosen from lithium or potassium, which in turn is useful in the synthesis of a compound of Formula (I). The compound of Formula (II) is then reacted in this scheme with, for example, chloro dimethylsilane. Accordingly, in a third aspect of the invention, there is provided a compound of Formula (II) as set forth above.

In a fourth aspect of the invention, there is thus provided a process for preparing a compound of Formula (I):

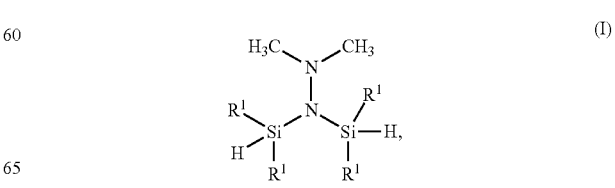

(I)

wherein each $R^1$ is independently chosen from hydrogen, $C_1$-$C_4$ alkyl, or a halide atom chosen from Cl, Br, and I, which comprises the steps:

A. contacting a compound of the formula

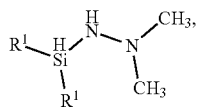

with a compound of the formula M-$R^3$, wherein M is lithium or potassium and $R^3$ is a $C_1$-$C_6$ alkyl group, optionally containing a nitrogen atom, to provide a compound of Formula (II):

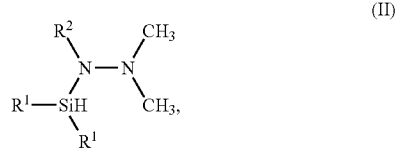

(II)

wherein each $R^1$ is independently chosen from hydrogen, $C_1$-$C_4$ alkyl, or a halide atom chosen from Cl, Br, and I, and wherein $R^2$ is chosen from lithium or potassium; followed by B. reacting the compound of Formula (II) with a compound of the formula

wherein X is a halogen.

As used herein, the term "silicon-containing film" refers to films such as silicon dioxide, silicon nitride, silicon oxynitride, silicon carbide, silicon carbonitride, silicon oxycarbonitride, low-k thin silicon-containing films.

In certain embodiments, vapor deposition conditions comprise reaction conditions known as chemical vapor deposition, pulsed-chemical vapor deposition, and atomic layer deposition. In the case of pulsed-chemical vapor deposition, a series of alternating pulses of precursor compounds and co-reactant(s), either with or without an intermediate (inert gas) purge step, can be utilized to build up the film thickness to a desired endpoint.

The compounds of Formula (I) are capable of low-temperature CVD and/or ALD formation of silicon-containing films. Such compounds exhibit high volatility and chemical reactivity, but are stable with respect to thermal degradation at temperatures involved in the volatilization or vaporization of the precursor, allowing consistent and repeatable transport of the resulting precursor vapor to the deposition zone or reaction chamber.

In certain embodiments, the pulse time (i.e., duration of precursor exposure to the substrate) for the precursor compounds depicted above ranges between about 0.1 and 30 seconds. In other embodiments, the pulse time for the co-reactant ranges from about 0.1 to about 30 seconds.

In one embodiment, the vapor deposition conditions comprise a temperature of about 50° C. to about 750° C. In another embodiment, the vapor deposition conditions comprise a temperature of about 2000 to about 650° C. In another embodiment, the vapor depositions comprise a temperature of about 5000 to 550° C.

In one embodiment, the vapor pressure conditions comprise a pressure of about 0.5 to about 1000 Torr.

The compounds above can be employed for forming high-purity thin silicon-containing films by any suitable vapor deposition technique, such as CVD, digital (pulsed) CVD, ALD, and pulsed plasma processes (PEALD). Such vapor deposition processes can be utilized to form silicon-containing films on microelectronic devices by utilizing deposition temperatures of from about 2500 to about 550° C. to form films having a thickness of from about 20 angstroms to about 2000 angstroms.

In the process of the invention, the compounds above may be reacted with the desired microelectronic device substrate in any suitable manner, for example, in a single wafer CVD, ALD and/or PECVD or PEALD chamber, or in a furnace containing multiple wafers.

Alternately, the process of the invention can be conducted as an ALD or ALD-like process. As used herein, the terms "ALD or ALD-like" refers to processes such as (i) each reactant including the silicon precursor compound of Formula (I) and an oxidizing and/or reducing gas is introduced sequentially into a reactor such as a single wafer ALD reactor, semi-batch ALD reactor, or batch furnace ALD reactor, or (ii) each reactant, including the silicon precursor compound of Formula (I) and an oxidizing and/or reducing gas is exposed to the substrate or microelectronic device surface sequentially by moving or rotating the substrate to different sections of the reactor and each section is separated by an inert gas curtain, i.e., spatial ALD reactor or roll to roll ALD reactor.

In one aspect, the invention relates to a plasma enhanced atomic layer deposition process (PEALD) process for depositing low wet etching rates using the precursors of Formula (I) as described herein, together with hydrogen plasma or nitrogen plasma. Nitrogen plasma is useful for the formation of silicon nitride films used in conjunction with the precursor compounds of Formula (I).

Thus, in another embodiment, the vapor deposition processes above may further comprise a step involving exposing the film to a reducing gas. In certain embodiments of the present invention, the reducing gas is comprised of gases chosen from $H_2$, hydrazine ($N_2H_4$), methyl hydrazine, t-butyl hydrazine, 1,1-dimethylhydrazine, 1,2-dimethylhydrazine, alkylamines, pyridine, and $NH_3$.

In another embodiment, the vapor deposition processes may further comprise a step involving exposing the precursor to an oxidizing gas such as $O_2$, $O_3$, $N_2O$, water vapor, alcohols, or oxygen plasma to form a silicon dioxide film. In those cases where $R^1$ is halo, then oxidizers such as water and alcohols can be used with bases such as pyridine, alkyl amines, N, N'-dimethylformamide, and ammonia. In certain embodiments, the oxidizing gas further comprises an inert gas such as argon, helium, nitrogen, or a combination thereof. In another embodiment, the oxidizing gas further comprises nitrogen, nitrous oxide or ammonia, which can react with the precursors of Formula (I) under plasma conditions to form silicon oxynitride films.

In general, the desired film produced using the precursor compounds of Formula (I) can be tailored by choice of each compound and reaction conditions, coupled with the utilization of reducing or oxidizing co-reactants. See, for example, Scheme 1 below:

Scheme 1

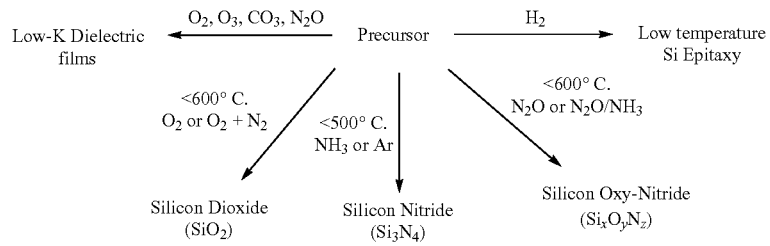

In the case of bis(dimethylsilyl) dimethyl hydrazine (Formula (I) when each $R^1$ is methyl), the resulting $SiO_2$ film exhibited a growth rate of 1.3 Å/cycle at 450° C. and exhibited very fast surface saturation in an oxygen plasma process.

In one embodiment, an oxidizing gas such as ozone ($O_3$) is utilized in a vapor deposition process to provide fast-growing silicon dioxide films. In one embodiment, the temperature is about 5000 to 600° C. In the case of an ozone process, a growth rate of 1.9 to about 5.8 Å/cycle was observed. Additionally, the wet etch rate of the resulting $SiO_2$ films showed improvement over a comparison film utilizing BTBAS (bis(t-butylamino)silane) as the silicon precursor.

In the case of silicon dioxide films, exemplary pulsing regimes include the following:
  (i) injection of precursor of Formula (I) for 0.1 to 30 seconds, followed by
  (ii) purging for 1 to 30 seconds using an inert gas, followed by
  (iii) injection of ozone at a flow rate of 50 to 500 sccm (standard cubic centimeters per minute), for about 0.1 to 30 seconds, followed by
  (iv) purging for 1 to 30 seconds using an inert gas. (One cycle). Steps (i) through (iv) can thus be repeated until a film of desired thickness has been obtained.

Thus, in another embodiment, the invention provides a method for preparing a silicon dioxide film, wherein the vapor deposition conditions comprise a temperature of about 150° C. to about 650° C., and a pulsing sequence comprising the steps:
  (i) injection of precursor of Formula (I) for 0.1 to 30 seconds, followed by
  (ii) purging for 1 to 30 seconds using an inert gas, followed by
  (iii) injection of ozone at a flow rate of 50 to 500 sccm, for about 0.1 to 30 seconds, followed by
  (iv) purging for 1 to 30 seconds using an inert gas, and repeating steps (i) through (iv) until a film of desired thickness has been obtained.

In one embodiment, nitrogen plasma is utilized in a vapor deposition process to provide silicon nitride films. In one embodiment, the temperature is about 2000 to 300° C. In the case of bis(dimethylsilyl) dimethyl hydrazine, utilized with nitrogen plasma at a power of 200 watts to 300 watts, a flow rate of 100 to 300 sccm of $N_2$, provided silicon nitride.

In the case of silicon nitride films, exemplary pulsing regimes include the following:
  (i) injecting a precursor of Formula (I) for 0.1 to 30 seconds, followed by
  (ii) purging for 1 to 30 seconds using an inert gas, followed by
  (iii) injection of nitrogen plasma using $N_2$ at a flow rate of 50 to 500 sccm, and at a power of about 50 watts to 1000 watts, for 0.1 to 30 seconds, followed by
  (iv) an optional purge of 1 to 30 seconds using an inert gas after the plasma exposure. (One cycle). Steps (i) through (iv) can thus be repeated until a film of desired thickness has been obtained.

Thus, in another embodiment, in the preparation of silicon nitride films, the vapor deposition conditions comprise a temperature of about 150° C. to about 300° C., a pressure of about 0.1 to about 5 Torr, and a pulsing sequence comprising the steps:
  (i) injection of precursor of Formula (I) for 0.1 to 30 seconds, followed by
  (ii) purge for 1 to 30 seconds using an inert gas, followed by
  (iii) injection of nitrogen plasma using $N_2$ at a flow rate of 50 to 500 sccm, and at a power of about 50 watts to 500 watts, for 0.1 to 30 seconds, followed by
  (iv) an optional purge of 1 to 30 seconds using an inert gas after the plasma exposure, and repeating steps (i) through (iv) until a film of desired thickness has been obtained.

While using the precursor compounds of Formula (I), the incorporation of carbon and nitrogen into such films is a natural consequence of the composition of such compounds and the process conditions can be tuned to favor incorporation or rejection of these elements. Additionally if carbon incorporation is desired, carbon in the form of methane, ethane, ethylene, or acetylene, for example, can be utilized to further introduce carbon content into the silicon-containing films, thereby producing silicon carbide, silicon carbonitride or silicon carbooxide.

The deposition methods disclosed herein may involve one or more purge gases. The purge gas, which is used to purge away unconsumed reactants and/or reaction by-products, is an inert gas that does not react with the precursors. Exemplary purge gases include, but are not limited to, argon, nitrogen, helium, neon, hydrogen, and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor. Note that gases, for example, nitrogen, is inert and acts as a purge when it is not activated by plasma, but is a co-reactant when it is activated by plasma.

The respective step of supplying the silicon precursor compounds, oxidizing gas, reducing gas, and/or other precursors, source gases, and/or reagents may be performed by changing the sequences for supplying them and/or changing the stoichiometric composition of the resulting dielectric film.

Energy is applied to the at least one of the silicon precursor compounds of Formula (I) and oxidizing gas, reducing gas, or combination thereof to induce reaction and to form the silicon-containing film on the microelectronic device substrate. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In other embodiments, a DC bias can be maintained between the plasma and the substrate. In embodiments wherein the deposition involves plasma, the plasma-generated process may comprise a direct plasma-generated process in which plasma is directly generated in the reactor, or alternatively, a remote plasma-generated process in which plasma is generated "remotely" of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, and porous inorganic materials, metals such as copper, aluminum, cobalt, tungsten, molybdenum, ruthenium and iridium, and and diffusion barrier layers such as but not limited to TiN, Ti(C)N, TaN, Ta(C)N, Ta, WN, WC, MoC or MoN. The films are compatible with a variety of subsequent processing steps such as, for example, chemical mechanical planarization (CMP) and anisotropic etching processes.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1—Synthesis of Dimethylhydrazido-Dimethylsilane

To an ice cold solution of N,N'-dimethylhydrazine (88.93 g, 1.48 mol) in n-pentane(350 g, 4.85 mol), a solution of chlorodimethylsilane(70 g, 0.74 mol) in n-pentane(70 g, 0.97 mol) was added dropwise and stirred at below −10° C. After the addition of the chlorodimethylsilane solution, the reaction mixture was stirred at room temperature for 5 hours. The white slurry obtained was filtered and washed with n-pentane (125 g). After removal of volatiles, the crude product obtained was purified by a simple distillation at 50° C. under 240 torr to yield the title compound as a colorless liquid (62.50 g, 71.4%).

Example 2—Synthesis of Bis(Dimethylsilyl)Dimethylhydrazine

To a solution of dimethylhydrazido-dimethylsilane (60 g, 0.507 mol) in n-hexane (210 g, 2.44 mol), a solution of n-butyllithium in n-hexane (203 mL, 2.5 mol) was added dropwise at −20° C. After the addition of the n-butyllithium solution, the reaction mixture was stirred at room temperature for 2 hours and then allowed to cool to −10° C. To this reaction mixture, a solution of chlorodimethylsilane in n-hexane was added dropwise, followed by 5 hours of stirring at room temperature. The white slurry obtained was filtrated and washed with n-hexane (90 g). After removal of volatiles, the crude product obtained was purified by a simple distillation at 80° C. under 80 torr to yield the final product as a colorless liquid (78.71 g, 63.5%).

Example 3—Deposition of Silicon Dioxide Film

A silicon oxide film was deposited by using bis(dimethylsilyl)dimethylhydrazine vapor as the silicon precursor. The bis(dimethylsilyl)dimethylhydrazine was placed in a bubbler at room temperature. A double shower head ALD reactor was used to deposit a silicon oxide film on a silicon wafer with ozone co-reactant at 500 to 600° C. as wafer temperature. Reactor pressure was controlled between 0.5 to 1.5 Torr. A silicon oxide film was formed using the following pulse sequence: a 28 second silicon precursor puls pulse, 20 second Ar purge, 25 second ozone pulse and 20 second Ar purge. This sequenc was repeated for 160 cycles to give a film thickness of 400 Å. The deposition rate was saturated at about 2.5 Å/cycle at 550° C. without carbon and chlorine impurities in the film. The film wet etch rate was obtained 51.4 Å/min using 0.2% HF diluted solution.

Example 4—Deposition of Silicon Nitride Film

A silicon nitride film was deposited using bis(dimethylsilyl)dimethylhydrazine as the silicon source precursor material. A bubbler of BDMSDMH was held at a room temperature (approximately 23° C.), and the reactor pressure was controlled at 0.5 to 1.5 Torr. A silicon nitride film was formed using the following pulse sequence: 28 second silicon precursor pulse, 20 second Ar purge, 15 or 20 seconds of direct nitrogen plasma at 13.56 MHz frequency pulse at 200 or 300 W and 20 second Ar purge. This sequence was repeated for 170 cycles to give a film thickness of 200 Å. The process was saturated at about 1.16 Å/cycle at 300° C. without carbon and chlorine impurities in the film.

The invention has been described in detail with particular reference to certain embodiments thereof, but it will be understood that variations and modifications can be effected within the spirit and scope of the invention.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in details, particularly in matters of shape, size, and arrangement of parts without exceeding the scope of the disclosure. The disclosure's scope is, of course, defined in the language in which the appended claims are expressed.

The invention claimed is:
1. A compound of Formula (I):

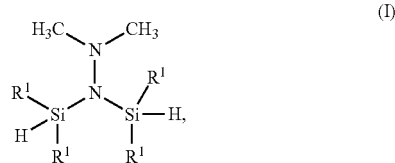

wherein each $R^1$ is independently selected from a group consisting of hydrogen, $C_1$-$C_4$ alkyl, or a halogen atom selected from a group consisting of Cl, Br, and I, and wherein at least one $R^1$ is other than hydrogen.

2. The compound of claim 1, wherein each $R^1$ is methyl.
3. The compound of claim 1, wherein each $R^1$ is ethyl.
4. The compound of claim 1, wherein each $R^1$ is a halogen atom selected from a group consisting of Cl, Br, and I.
5. A process for preparing a compound of Formula (I):

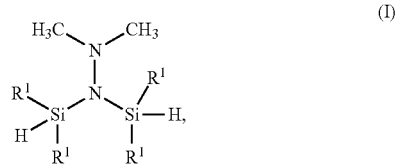

wherein each $R^1$ is independently selected from a group consisting of, $C_1$-$C_4$ alkyl, or a halogen atom selected from a group consisting of Cl, Br, and I, wherein at least one $R^1$ is other than-hydrogen, which comprises the steps:

A. contacting a compound of the formula

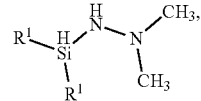

with a compound of the formula M-$R^3$, wherein M is lithium or potassium and $R^3$ is a $C_1$-$C_6$ alkyl group, optionally containing a nitrogen atom, to provide a compound of Formula (II):

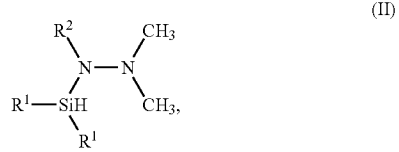

wherein each $R^1$ is independently selected from a group consisting of hydrogen, $C_1$-$C_4$ alkyl, or a halide atom selected from a group consisting of Cl, Br, and I, and wherein $R^2$ is chosen from lithium or potassium; followed by B. Reacting the compound of Formula (II) with a compound of the formula

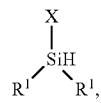

wherein X is a halogen.
6. The process of claim 5, wherein each $R^1$ is methyl.
7. The process of claim 5, wherein the compound of the formula M-$R^3$ is selected from a group consisting of n-butyl lithium, methyl lithium, t-butyl lithium, lithium diisopropylamide, methyl potassium, and n-butyl potassium.
8. The process of claim 5, wherein each $R^1$ is methyl, X is chloro, and M is lithium.
9. A method for depositing a silicon-containing film onto a surface of a microelectronic device, which comprises introducing at least one compound of Formula (I)

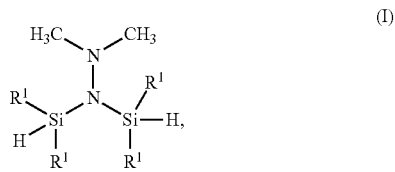

wherein each $R^1$ is independently selected from a group consisting of hydrogen, $C_1$-$C_4$ alkyl, or a halogen atom selected from a group consisting of Cl, Br, and I, and wherein at least one $R^1$ is other than hydrogen,
to said surface in a reaction chamber, under vapor deposition conditions.

10. The method of claim 9, wherein the silicon-containing film is silicon dioxide.
11. The method of claim 9, wherein the silicon-containing film is silicon nitride.
12. The method of claim 9, wherein the vapor deposition conditions are selected from a group consisting of chemical vapor deposition (CVD), atomic layer deposition (ALD), plasma-enhanced ALD (PEALD), plasma enhanced cyclical chemical vapor deposition (PECCVD), a flowable chemical vapor deposition (FCVD), a plasma-enhanced ALD-like process, or an ALD process with oxygen-containing reactants, a nitrogen-containing reactant, or a combination thereof.
13. The method of claim 10, wherein the vapor deposition conditions comprise a temperature of about 150° C. to about 650° C., and a pulsing sequence comprising the steps:
(v) injection of precursor of Formula (I) for 0.1 to 30 seconds, followed by
(vi) purging for 1 to 30 seconds using an inert gas, followed by
(vii) injection of ozone at a flow rate of 50 to 500 sccm, for about 0.1 to 30 seconds, followed by
(viii) purging for 1 to 30 seconds using an inert gas, and repeating steps (i) through (iv) until a film of desired thickness has been obtained.
14. The method of claim 13, wherein the compound of Formula (I) is bis(dimethylsilyl)dimethylhydrazine.
15. The method of claim 13, wherein the temperature is about 500 to 550° C.

* * * * *